United States Patent
Nakamura

(10) Patent No.: US 10,251,296 B2
(45) Date of Patent: Apr. 2, 2019

(54) CLIP AND FIXING MECHANISM

(71) Applicant: Kitagawa Industries Co., Ltd., Inazawa-shi, Aichi (JP)

(72) Inventor: Tatsuya Nakamura, Kasugai (JP)

(73) Assignee: Kitagawa Industries Co., Ltd. (JP)

( * ) Notice: Subject to any disclaimer, the term of this patent is extended or adjusted under 35 U.S.C. 154(b) by 0 days.

(21) Appl. No.: 16/066,013

(22) PCT Filed: Dec. 22, 2016

(86) PCT No.: PCT/JP2016/088425
§ 371 (c)(1),
(2) Date: Jun. 25, 2018

(87) PCT Pub. No.: WO2017/111051
PCT Pub. Date: Jun. 29, 2017

(65) Prior Publication Data
US 2019/0014676 A1    Jan. 10, 2019

(30) Foreign Application Priority Data
Dec. 25, 2015    (JP) ................................. 2015-253813

(51) Int. Cl.
*H01R 12/00* (2006.01)
*H05K 7/12* (2006.01)
(Continued)

(52) U.S. Cl.
CPC ................. *H05K 7/12* (2013.01); *F16B 1/00* (2013.01); *F16B 2/245* (2013.01); *H01R 4/48* (2013.01);
(Continued)

(58) Field of Classification Search
CPC ........................... H01R 9/0735; H01R 9/0736
(Continued)

(56) References Cited

U.S. PATENT DOCUMENTS 4,647,123 A * 3/1987 Chin .................... G06F 12/0676
361/785
6,296,493 B1 * 10/2001 Michiya ............. H01R 13/2414
439/66

(Continued)

FOREIGN PATENT DOCUMENTS

| JP | 3609762 | 1/2005 |
| JP | 2011-501477 | 1/2011 |
| JP | 2013-168508 | 8/2013 |

*Primary Examiner* — Phuong Chi T Nguyen
(74) *Attorney, Agent, or Firm* — Thorpe North & Western

(57) ABSTRACT

A clip is provided with a base portion, at least one holding portion, and a guiding portion. The holding portion includes spring pieces including a first and second spring pieces connected to the base portion and facing each other, and sandwiches an insert inserted between these spring pieces. The guiding portion includes a contact surface that guides the insert toward a position between the first and second spring pieces when the insert moves in an insertion direction and the guide portion comes into contact with the insert. The contact surface is at least partially in a position farther away from the base portion than the second portion of at least one of the first or second spring pieces. The contact surface is at least partially, in relation to a facing direction, in a position farther away from the corresponding spring piece than the second portion of the one spring piece.

4 Claims, 10 Drawing Sheets

(51) Int. Cl.
  *F16B 2/24*    (2006.01)
  *F16B 1/00*    (2006.01)
  *H01R 4/48*    (2006.01)
  *H05K 9/00*    (2006.01)
  *H01R 12/57*   (2011.01)
(52) U.S. Cl.
  CPC ........... *H01R 12/57* (2013.01); *H05K 9/0007* (2013.01); *F16B 2001/0064* (2013.01)
(58) Field of Classification Search
  USPC .................................................. 439/67, 493
  See application file for complete search history.

(56)           References Cited

U.S. PATENT DOCUMENTS 6,508,664 B2 *  1/2003  Phalen ................. H01R 13/112
                                                        439/502
  8,066,515 B2 * 11/2011  Johnson ................ G06F 1/184
                                                         439/61

* cited by examiner

CLIP AND FIXING MECHANISM

CROSS-REFERENCE TO RELATED APPLICATION

This application is the U.S. national stage of international application number PCT/JP2016/088425, filed on Dec. 22, 2016, which claims priority to Japanese Patent Application No. 2015-253813A, filed to Japan Patent Office on Dec. 25, 2015, and the total contents of each are hereby incorporated by reference.

TECHNICAL FIELD

The present disclosure relates to a clip that is to be soldered to a printed wiring board and used for fixing a shielding case or the like.

BACKGROUND ART

In the related art, clips that are to be soldered to a printed wiring board and used for fixing a shielding case or the like have been utilized. In Japanese Unexamined Patent Application Publication No. 2013-168508A, there is described a clip that includes holding spring portions that form a pair and are disposed facing each other. The holding spring portions of this clip each extend upward from a bottom surface, with an extended tip thereof bent inward and downward.

In the clip according to Japanese Unexamined Patent Application Publication No. 2013-168508A, a portion of a leading edge bent inward is inclined inward and downward. As a result, when an insert of a shielding case is inserted into the holding spring portions, the insert can be guided to a center even when a position where the insert is to be inserted shifts from the center of the holding spring portions.

However, in each of the holding spring portions, the portion extending upward from the bottom surface and a significant portion of the bending portion of the leading edge thereof do not have the guiding function described above. As a result, a range of the guiding function is small with respect to a size of the clip, and insertion of the insert tends to become difficult.

SUMMARY

According to one aspect of the present disclosure, it is desirable to propose a clip capable of being soldered to a printed wiring board and facilitating insertion of an insert.

A first aspect of the present disclosure is a clip to be soldered to a conductive portion of a printed wiring board. The clip includes a base portion having a plate shape, at least one holding portion, and a guiding portion. The base portion includes a joining portion soldered to the conductive portion. The at least one holding portion includes a pair of spring pieces including a first spring piece and a second spring piece connected to the base portion and facing each other, and sandwiches an insert inserted between the first spring piece and the second spring piece. The guiding portion guides the insert to a position between the first spring piece and the second spring piece.

In this clip, the first spring piece and the second spring piece constituting the holding portion each include a first portion and a second portion. Further, the first spring piece and the second spring piece are each configured to be elastically displaceable in a facing direction, which is a direction in which the first spring piece and the second spring piece are disposed side-by-side. The first portion is configured to extend in a direction that intersects the base portion. The second portion is connected in a bent manner to an end portion of the first portion opposite to an end portion connected to the base portion, and extends in a direction toward the corresponding spring piece of the pair of spring pieces as well as in a direction approaching the base portion.

Further, the guiding portion includes a contact surface that guides the insert toward a position between the first spring piece and the second spring piece in a case where the insert moves in an insertion direction and the guiding portion comes into contact with the insert. Here, the insertion direction is the direction of movement of the insert from a state of not being sandwiched to a state of being sandwiched by the first spring piece and the second spring piece. The contact surface is at least partially, in relation to the insertion direction, in a position farther away from the base portion than the second portion of at least one of the spring pieces of the first spring piece or the second spring piece. Further, the contact surface is at least partially, in relation to the facing direction, in a position farther away from the corresponding spring piece than the second portion of the pair of spring pieces.

According to the clip thus configured, the contact surface guides the insert to a position sandwiched between the first spring piece and the second spring piece during insertion into the holding portion. With the contact surface disposed in a position farther away from the corresponding spring piece than the second portion of the one spring piece as described above, a guidable range is wide compared to when the insert is guided by only the second portion. Thus, insertion of the insert can be easily performed.

Note that the clip described above may be used for a member having a plate shape as the insert. Further, the clip includes at least two of the holding portions described above, and the two holding portions may be disposed side-by-side, allowing the insert to be sandwiched from a front surface side and a rear surface side, respectively. Further, the contact surface may be disposed at least between the two holding portions in the direction in which the two holding portions are disposed side-by-side.

According to the clip thus configured, the contact surface is disposed between the two holding portions, making it possible to suppress an increase in a size of the clip.

Further, in the clip described above, at least one of the first spring piece or the second spring piece may include a third portion that extends from the second portion in a direction opposite to the direction toward the corresponding spring piece of the pair of spring piece, and in a direction away from the base portion. Further, the contact surface may be configured to be formed at least on the third portion.

According to the clip thus configured, the contact surface is formed on the third portion extending from the spring piece, making it possible to suppress an increase in the size of the clip.

Further, the second aspect of the present disclosure is a fixing mechanism that includes the clip according to the first aspect described above and an insert. In this fixing mechanism, the clip further includes a convex portion that is provided to at least one of the spring pieces including the first spring piece or the second spring piece and is convex toward the other of the spring pieces that differs from the at least one of the spring pieces. Further, the insert includes an insertion space where the convex portion is inserted when the insert is sandwiched between the first spring piece and the second spring piece.

When the fixing mechanism is thus configured, the convex portion of at least one of the spring pieces is inserted into the insertion space when the insert is inserted into the holding portion and moved to a predetermined position. When the insert is inserted by a worker, a vibration when the convex portion is inserted into the insertion space is felt as feedback, allowing the worker to verify that an assembly is appropriate.

Note that, in the fixing mechanism described above, the insertion space of the insert may be formed to have a length greater than a length of the convex portion by a predetermined ratio or greater in a direction orthogonal to both the insertion direction and the facing direction, with the insert sandwiched between the first spring piece and the second spring piece.

When the fixing mechanism is thus configured, the positions of the convex portion and the insertion space need not be strictly aligned when the insert is inserted into the holding portion, thereby making the insertion work easier to be performed.

DETAILED DESCRIPTION

Figure 1A:
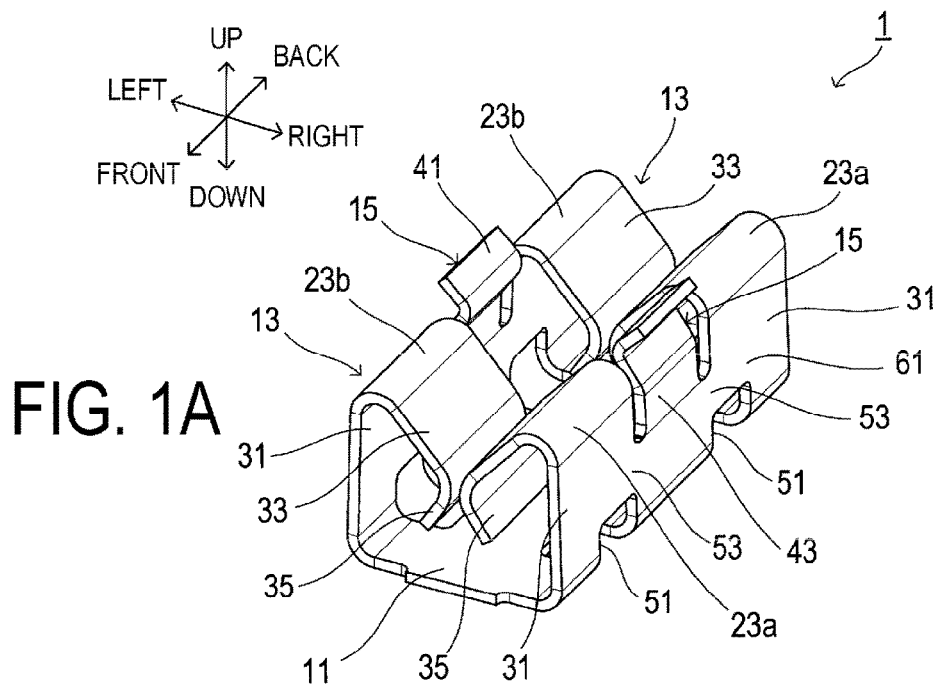
FIGS. 1A and 1B are perspective views illustrating a clip of a first embodiment.
Figure 1B:
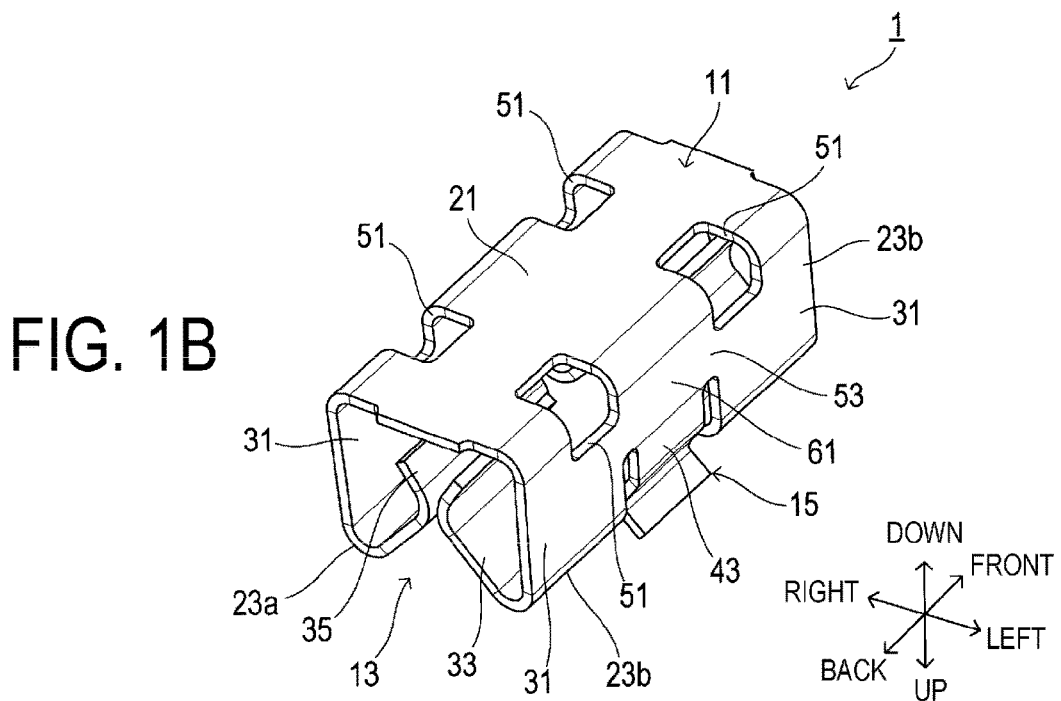
Figure 2A:
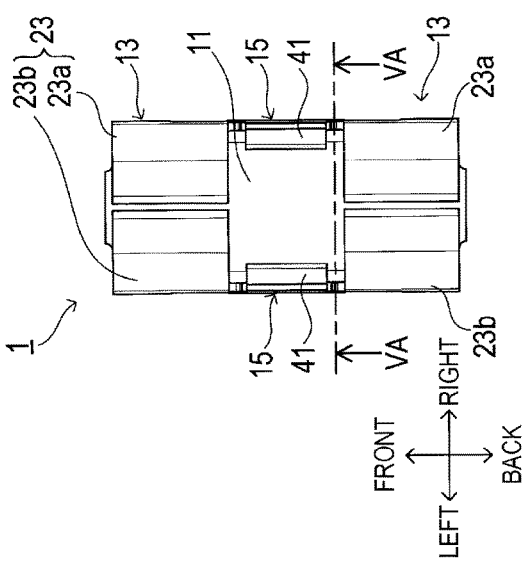
FIG. 2A is a plan view illustrating the clip of the first embodiment.
Figure 2B:
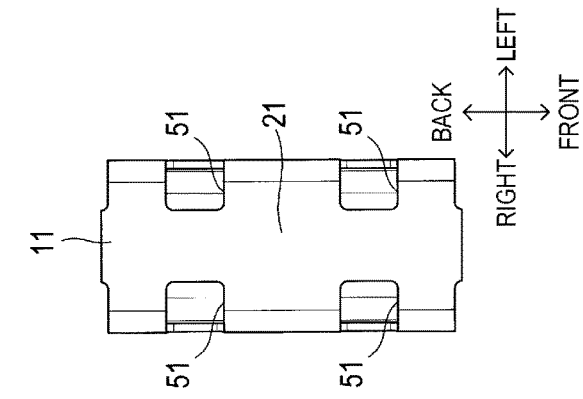
FIG. 2B is a right-side view illustrating the clip of the first embodiment.
Figure 2C:
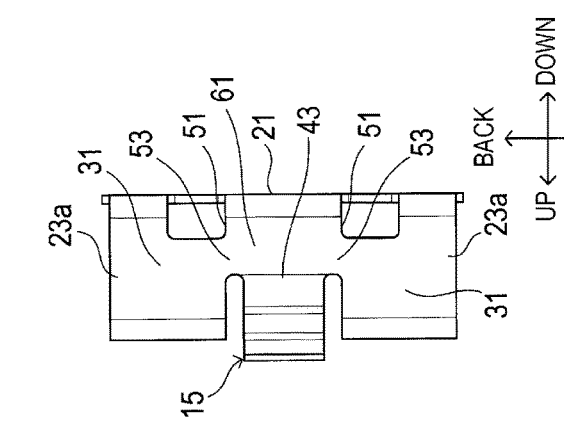
FIG. 2C is a bottom view illustrating the clip of the first embodiment.
Figure 2D:
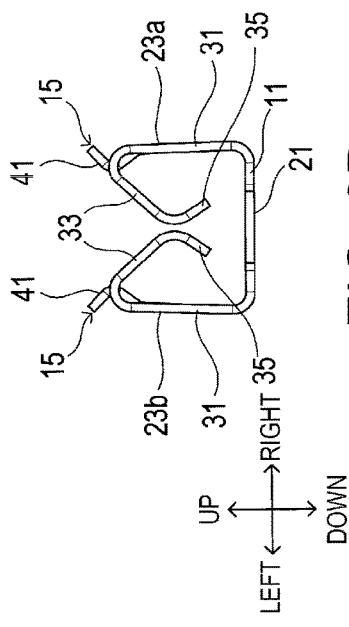
FIG. 2D is a front view illustrating the clip of the first embodiment.

Embodiments of the present disclosure will be described below along with drawings.

1. First Embodiment 1-1. Overall Configuration

A clip 1 illustrated in FIGS. 1A, 1B, and 2A to 2D is surface mounted to a conductive portion of a printed wiring board by soldering, and functions as a clip that sandwiches and holds an insert serving as the object to be held on the printed wiring board.

The conductive portion corresponds to a portion of the printed wiring such as a copper layer that connects electronic parts mounted to the printed wiring board. When the insert described above is a conductive member, the conductive portion described above and the insert can be electrically connected.

The clip 1 is conceivably formed by press-processing a sheet metal having electrical conductivity. Note that the material and formation method of the clip 1 are not particularly limited.

The clip 1 includes a base portion 11, holding portions 13, guiding portions 15, and the like. While the configuration of the clip 1 is hereinafter described using directions such as front-back, up-down, and left-right for the sake of convenience, these directions are merely defined for explaining the positional relationship of each component and do not limit the way the clip 1 is attached, the form of use, or the like.

The base portion 11 is a member that has a plate shape and extends in the front-back direction and the left-right direction. The base portion 11 includes a joining surface 21 soldered to a conductive portion of the printed wiring board described above on a lower side. That is, the base portion 11 is a portion disposed along the printed wiring board on the printed wiring board. Thus, with the clip 1 attached to the printed wiring board, the holding portions 13 and the guiding portions 15 that extend upward from the base portion 11 protrude from the printed wiring board. The joining surface 21 is an example of the joining portion.

An upper surface of the base portion 11 can be utilized as a suction surface for suctioning by a suction nozzle. For example, in FIG. 2A, the portion of the base portion 11 visible between two guiding portions 15 may be used as the suction surface. The holding portions 13 being disposed in the front and back of this portion is convenient because, when being used as a suction surface, the portion does not readily cause a balance of the clip 1 to collapse. The suction surface may be used for removing the clip 1 housed in an embossed carrier tape from the embossed carrier tape, for example.

The holding portions 13 each include a pair of spring pieces 23 that are connected to the base portion 11 and face each other. The pair of spring pieces 23 include a first spring piece 23a disposed on the right side, and a second spring piece 23b disposed on the left side. The first spring piece 23a and the second spring piece 23b are symmetrical in relation to planes extending in the up-down direction and the front-back direction.

In the explanation below, "the pair of spring pieces 23" refers to both the first spring piece 23a and the second spring piece 23b. Further, "one spring piece 23" refers to one spring piece without distinction between the first spring piece 23a and the second spring piece 23b.

The holding portions 13 each sandwich and hold an insert described later inserted between the first spring piece 23a and the second spring piece 23b of the pair of spring pieces 23 by the first spring piece 23a and the second spring piece 23b. That is, the holding portions 13 can fix the insert in a predetermined position on the printed wiring board. While the holding portions 13 are formed at two locations on ends of the base portion 11 in the front-back direction as described above, the holding portions 13 are symmetrical in relation to planes extending in the up-down direction and the left-right direction.

Each of the one spring pieces 23 constituting the holding portion 13 includes a first portion 31, a second portion 33, and a leading edge portion 35.

The first portion 31 extends in a direction that intersects the base portion 11, in other words, in a direction that intersects the joining surface 21, specifically upward.

The second portion 33 bends at an end portion on an upper side of the first portion 31, connects with the first portion 31, and extends in a direction toward the corresponding one spring piece 23 of the one spring piece 23 as well as in a direction approaching the base portion 11. The end portion on the upper side of the first portion 31 described above is the end portion opposite to the end portion of the first portion 31 that is connected with the base portion 11. Specifically, the second portion 33 extends from the upper right to the lower left in the first spring piece 23a, and from the upper left to the lower right in the second spring piece 23b.

The second portion 33 described above is connected to the first portion 31 in a bent manner from the first portion 31. In other words, a bent portion exists between the first portion 31 and the second portion 33, and an incline between the first portion 31 and the second portion 33 changes in at least the bent portion. Note that neither the first portion 31 nor the second portion 33 need to have a planar shape, and may have a curved shape.

The leading edge portion 35 bends at the extended leading edge of the second portion 33, connects with the second portion 33, and extends downward and in a direction opposite to the corresponding one spring piece 23 described above.

Each of the one spring pieces 23 is configured to be elastically displaceable in a facing direction, which is the direction in which the first spring piece 23a and the second spring piece 23b are disposed side-by-side. In the present embodiment, the left-right direction is the facing direction.

Two holding portions 13 are disposed side-by-side in a manner that allows a single member having a plate shape to be sandwiched from a front surface side and a rear surface side simultaneously. Specifically, the two holding portions 13 are disposed (i) on the same plane, (2) so that an insertion direction of the insert is downward, (iii) so that the facing direction is the left-right direction, and (iv) side-by-side in the front-back direction. The insertion direction will be described later.

Note that the first portion 31, when extended in a direction that intersects the base portion 11, may extend in a direction inclined from the direction that intersects the base portion 11.

The guiding portions 15 each guide an insert 3 to a position between the pair of spring pieces 23 when the insert 3 is inserted into the holding portions 13. This position, more specifically, is between the second portions 33 of each of the one spring pieces 23, and is sandwiched between the pair of spring pieces 23.

That is, in relation to the left-right direction, the guiding portions 15 each guide the insert to the left when the insert is positioned to the right of the position between the pair of spring pieces 23, and to the right when the insert is positioned to the left of the position between the pair of spring pieces 23.

The guiding portions 15 each include a contact surface 41, which is a surface inclined downward toward a center of the clip 1 in the left-right direction, and a contact surface support portion 43 that supports the contact surface 41. The arrangement of the contact surface 41 will be described later.

1-2. Operation of Clip

Figure 3:
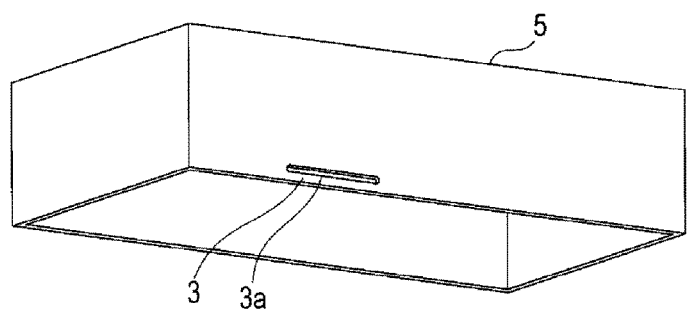
FIG. 3 is a perspective view illustrating an insert.

The insert 3 is a member having a plate shape. The insert 3 constitutes a portion of a lower end of a box 5 that is open on a bottom side, as illustrated in FIG. 3. A thickness of the insert 3 is greater than a space in the left-right direction between the first spring piece 23a and the second spring piece 23b. Further, a slit 3a is formed in the insert 3. The slit 3a is an example of the insertion space.

The two holding portions 13 sandwich the insert 3 from the front surface side and the rear surface side, respectively. In the process of this sandwiching, the two holding portions 13 operates in the same way, and thus only one will be described as representation. Note that the front surface side and the rear surface side here merely refer to one surface and the other surface of the main surfaces of the member having a plate shape, and do not signify any structural differences.

Figure 4A:
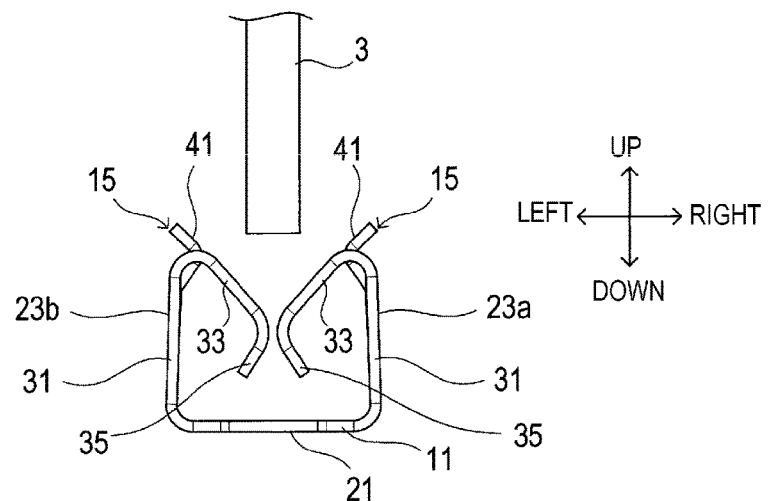
FIGS. 4A to 4C are diagrams for explaining a clip elastically deforming during insertion of the insert.
Figure 4B:
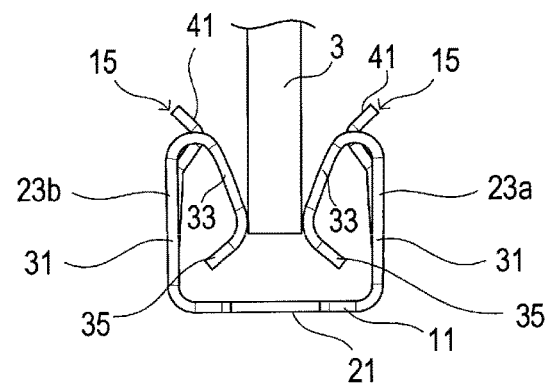
Figure 4C:
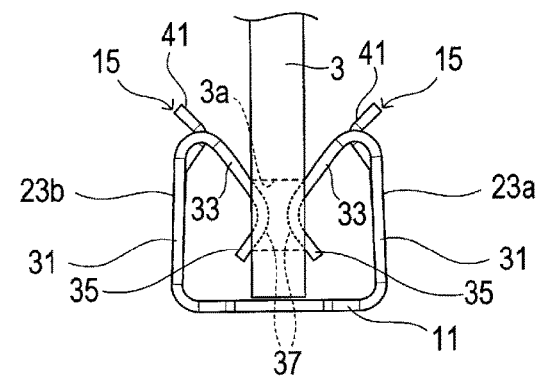

As illustrated in FIGS. 4A to 4C, when a downward load is applied to the insert 3 and the insert 3 is moved downward toward the position between the first spring piece 23a and second spring piece 23b, the insert 3 transitions from a state of not being sandwiched to a state being sandwiched by the pair of spring pieces 23. In the present embodiment, downward is the insertion direction. This insertion direction is not limited to a direction perpendicular to the joining surface 21, and may be inclined, for example.

When the insert 3 is moved to the position between the first spring piece 23a and the second spring piece 23b, the first spring piece 23a elastically deforms to the right and the second spring piece 23b elastically deforms to the left, as illustrated in FIG. 4B.

Furthermore, when the insert 3 is moved downward and moves to a position in contact with the base portion 11, the second portion 33 and a coupling portion 37 of the leading edge portion 35 are inserted into the slit 3a, as illustrated in FIG. 4C. This coupling portion 37 has a shape that is convex toward the corresponding spring piece 23 of the spring piece 23. This coupling portion 37 is an example of the convex portion. The coupling portion 37 may be formed only in one of the first spring piece 23a and the second spring piece 23b.

The first spring piece 23a and the second spring piece 23b, in the state illustrated in FIG. 4C, are elastically deformed so as to be separated at a greater distance from each other than in the state illustrated in FIG. 4A in which no load is applied. As a result, the insert 3 receives an elastic force and is sandwiched by the pair of spring pieces 23.

Figure 5A:
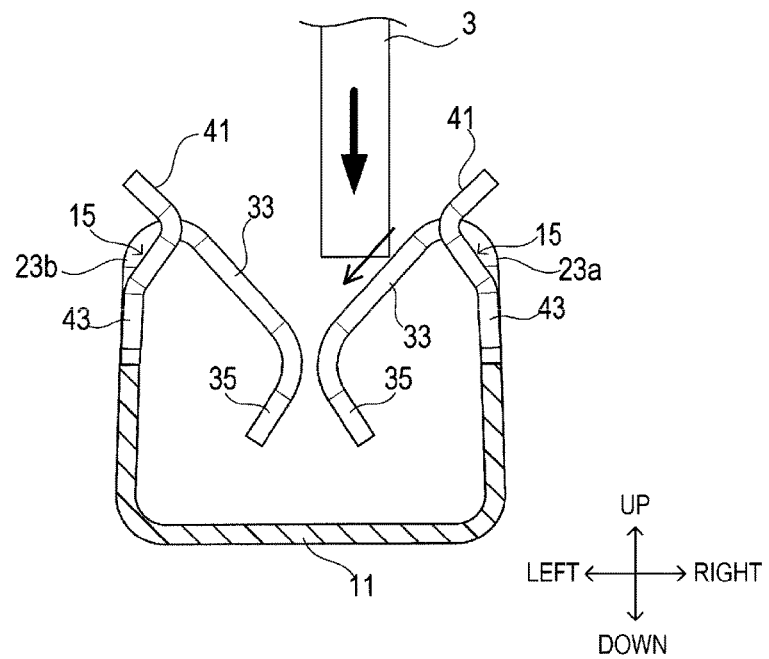
FIG. 5A is a cross-sectional view along VA-VA in FIG. 2A for explaining guidance of the insert by a second portion.

Next, the guiding function of the clip 1 when the insert 3 is inserted will be described. As illustrated in FIG. 5A, in the first spring piece 23a, the second portion 33 is configured so as to incline from the upper right to the lower left. When an external load acts on the insert 3, causing the insert 3 to move in the insertion direction from above and come into contact with the second portion 33, the insert 3 receives a leftward reactive force, slides to the lower left, and is guided to a position between the first spring piece 23a and the second spring piece 23b.

Figure 5B:
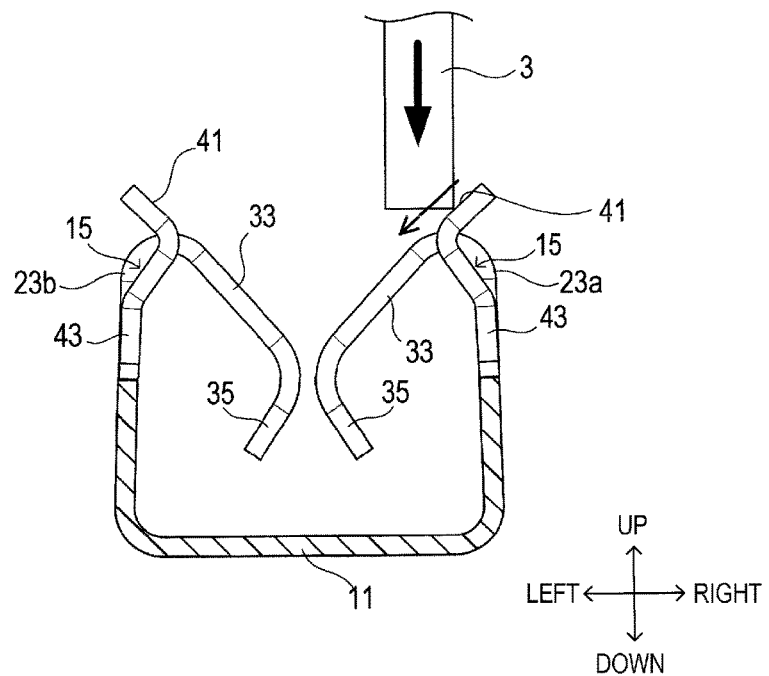
FIG. 5B is a cross-sectional view along VA-VA in FIG. 2A for explaining guidance of the insert by a contact surface.

Further, the contact surface 41 is also a surface that inclines from the upper right to the lower left and thus, as illustrated in FIG. 5B, when the insert 3 moves in the insertion direction and comes into contact with the contact surface 41, the insert 3 receives a leftward reactive force, slides to the lower left, and is guided to a position between the first spring piece 23a and the second spring piece 23b.

Figure 6:
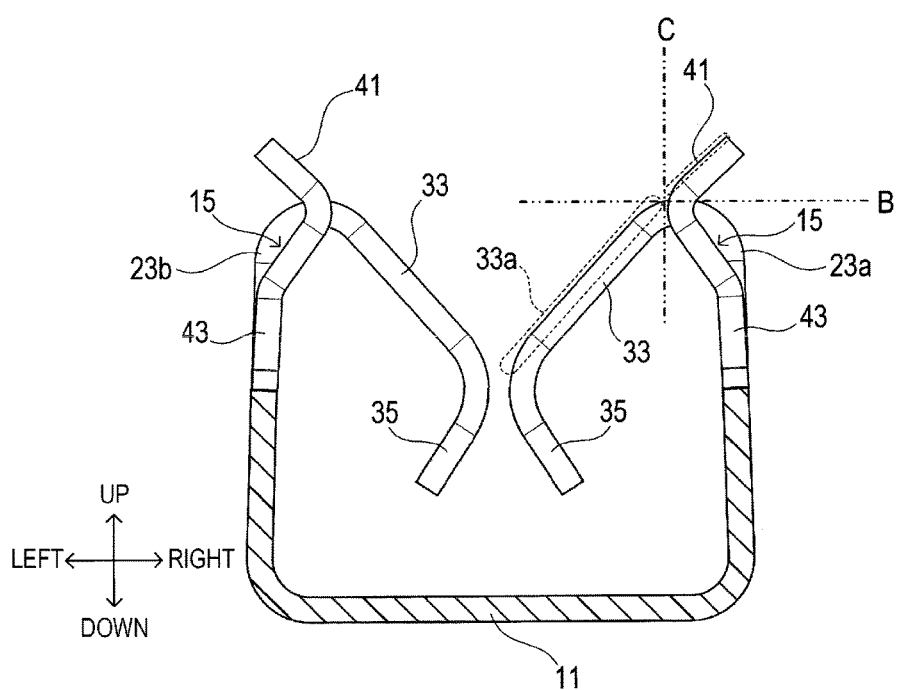
FIG. 6 is a cross-sectional view along VA-VA in FIG. 2A for explaining a positional relationship of the contact surface.

The contact surface 41 on the right side, as illustrated in FIG. 6, is in a position farther away from the base portion 11 than the second portion 33 of the first spring piece 23a in relation to the insertion direction, that is, the up-down direction. That is, the contact surface 41 is positioned above a virtual line B in FIG. 6. Further, the contact surface 41 is in a position farther away from the second spring piece 23b than the second portion 33 of the first spring piece 23a in relation to the facing direction, that is, the left-right direction. That is, the contact surface 41 is positioned to the right of a virtual line C. The contact surface 41 on the left side is also disposed in the same manner with respect to the second spring piece 23*b*.

Figure 7:
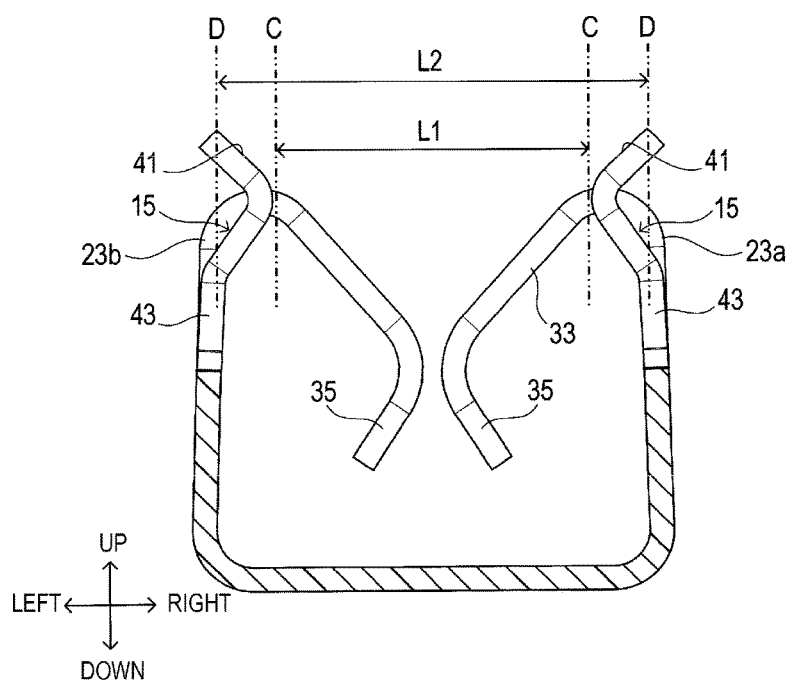
FIG. 7 is a cross-sectional view along VA-VA in FIG. 2A for explaining a range in which the insert is guided.

That is, the contact surface 41, as illustrated in FIG. 7, can expand the length of a width in the left-right direction in which the insert 3 can be guided from L1, which is a width executed by the pair of second portions 33 of the pair of spring pieces 23, that is, a length of the interval between the lines C, to L2, which is a width that includes the contact surfaces 41, that is, the length of the interval between virtual lines D.

Note that the contact surface 41 is provided between the two holding portions 13 in the direction in which the two holding portions 13 are disposed side-by-side, that is, the front-back direction. Thus, the effect of expanding the guidable width can be applied to both of the holding portions 13.

1-3. Other Shape Features

As illustrated in FIGS. 1A, 1B, and 2A to 2D, through-holes 51 are formed in two locations spaced apart in the front-back direction, from the base portion 11 to a side wall surface 61 that includes the first portion 31, the contact surface 41, and the like of the two holding portions 13. The elastic force of one spring piece 23 is adjusted by these through-holes 51. Further, the first portion 31 and the contact surface support portion 43 are connected by a connecting portion 53, increasing a rigidity of the contact surface support portion 43 and thus making it possible for the contact surface 41 to favorably execute guidance.

1-4. Advantageous Effects (1a) In the clip 1, the range in the left-right direction of the portion where the insert 3 is guided during insertion of the insert 3 into the holding portions 13 is expanded by the contact surfaces 41. Accordingly, it is easier to insert the insert 3 into the holding portions 13, making the assembly work of the box 5 easier.

Further, even when the insert 3 does not come into contact with the contact surfaces 41 during insertion of the insert 3 into the holding portions 13, the insert 3 is guided to a position between the first spring piece 23*a* and the second spring piece 23*b* by the incline of the second portions 33, as illustrated by FIG. 5A. That is, even when the insert 3 does not come into contact with the guiding portions 15, the insert 3 can be inserted into the clip 1 without the guiding portions 15 becoming an obstacle to the attachment of the insert 3.

(1b) In the clip 1, the contact surface 41 is disposed between the two holding portions 13. Accordingly, the clip 1 can be made compact in size compared to a configuration in which the contact surface 41 is disposed frontward of the holding portion 13 on the front side or backward of the holding portion 13 on the back side, for example. This is convenient particularly when the clip 1 is used with a small electronic device or the like.

Further, when the suction surface during suctioning of the clip 1 by the suction nozzle is a region positioned between the two guiding portions 15 of the base portion 11 when viewed from above, the contact surfaces 41 also accomplish the advantageous effect of guiding the position of the nozzle, making it possible to suppress suction errors.

(1c) When the insert 3 is inserted and moved to the predetermined position, the coupling portion 37, which is a portion of one spring piece 23, is inserted into the slit 3*a* formed in the insert 3. When a worker assembles the box 5, the worker can feel a vibration when the coupling portion 37 is inserted into the slit 3*a* as feedback, allowing the worker to verify that assembly is appropriate.

Further, the coupling portion 37 inserted into the slit 3*a* has a curved shape that is convex toward the slit 3*a* and, as illustrated in FIG. 4C, the slit 3*a* and one spring piece 23 come into contact at two locations, an upper end and a lower end, of an opening portion of the slit 3*a*. This makes it possible to decrease an impedance between the insert 3 and the clip 1, and thus improve a noise removal effect, for example.

(1d) In the clip 1, the second portion 33 inclines from the first portion, extending downward. As a result, when a lower end side of the second portion 33, that is, the leading edge portion 35 side, is pushed upward, the lower end of the second portion 33 is displaced in a manner rotating about the first portion 31, causing the lower end of the second portion 33 to move in a direction away from the first portion 31.

Thus, when the insert 3 attempts to move upward from the state of being sandwiched between the first spring piece 23*a* and the second spring piece 23*b*, the lower end of the second portion 33 catches on the slit 3*a* and moves upward along with the insert 3, causing the lower end of the second portion 33 to move to the insert 3 side. As a result, the force by which the second portion 33 sandwiches the insert 3 increases, suppressing an upward movement of the insert 3. This makes it possible to suppress unintended detachment of the insert 3 from the holding portions 13. This is convenient particularly when the clip 1 is used with, for example, an electronic device mounted in a vehicle and subjected to strong vibration.

2. Second Embodiment

2-1. Differences from First Embodiment

The configuration of the second embodiment is fundamentally the same as the configuration of the first embodiment. As such, description will be focused on differences and description of configurations that are the same will be omitted. Note that reference numerals in the present embodiment that are the same as those used in the first embodiment refer to the same constituents, and reference is made to the preceding description.

In the first embodiment described above, a configuration in which the contact surface 41 is disposed in a position between the two holding portions 13 in relation to the front-back direction is illustrated as an example. In contrast, the second embodiment differs from the first embodiment in that a contact surface is formed on the spring pieces as well.

Figure 8A:
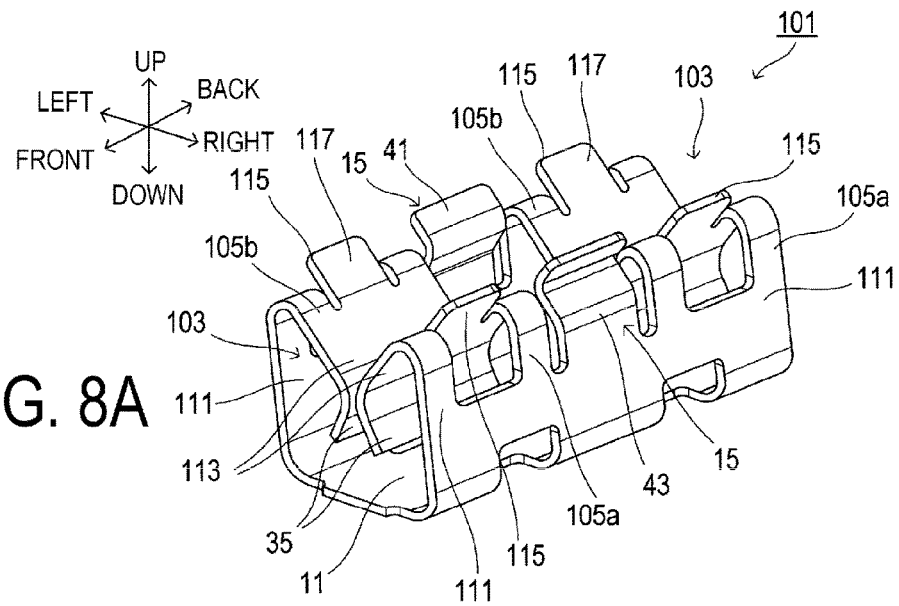
FIGS. 8A and 8B are perspective views illustrating a clip of a second embodiment.
Figure 8B:
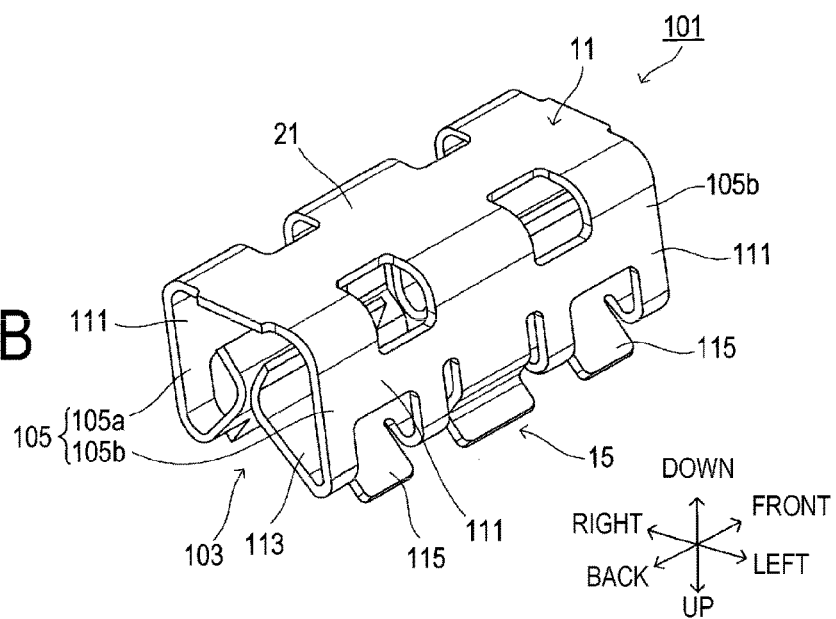

As illustrated in FIGS. 8A and 8B, a clip 101 includes two holding portions 103, and the holding portions 103 each include a pair of spring pieces 105. The pair of spring pieces 105 each include a first spring piece 105*a* and a second spring piece 105*b*. One spring piece 105 includes a first portion 111, a second portion 113, a third portion 115, and the like.

The third portion 115 extends from the second portion 113 in a direction away from the base portion 11 and in a direction opposite to the direction toward the corresponding one spring piece 105 of the one spring piece 105. An upper surface of this third portion 115 is formed as a contact surface 117, which is a surface that inclines downward toward a center of the clip 101 in the left-right direction. The third portion 115 is an example of the guiding portion. The contact surface 117 is positioned on the same plane as the upper surface of the second portion 113.

Figure 9:
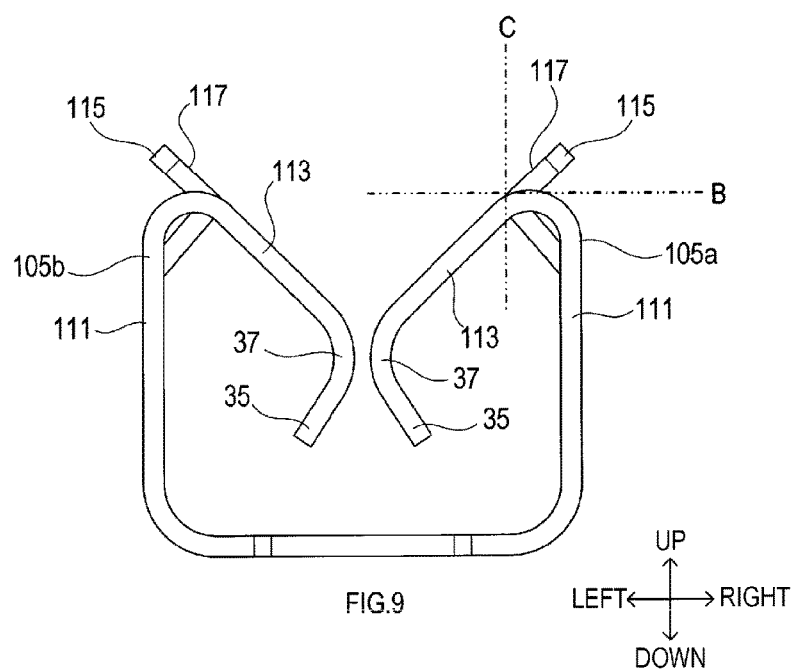
FIG. 9 is a front view illustrating the clip of the second embodiment.

The contact surface 117 formed on the first spring piece 105a, as illustrated in FIG. 9, is configured so that at least a portion thereof is in a position farther away from the base portion 11 than the second portion 113 of the first spring piece 105a in relation to the insertion direction. Further, the contact surface 117 is configured to be in a position farther away from the second spring piece 105b than the second portion 113 of the first spring piece 105a in relation to the facing direction.

That is, in the third portion 115 extending from the first spring piece 105a, a portion of the contact surface 117 is positioned above the line B and to the right of the line C.

Note that, while the contact surface 117 is formed on all one spring pieces 105 in the present embodiment as an example, the configuration may be such that the contact surface 117 is formed on at least one spring piece 105.

2-2. Advantageous Effects

In addition to the advantageous effects of the first embodiment described above, the following advantageous effects are obtained according to the second embodiment described above.

(2a) In the clip 101, the range in the left-right direction of the portion where the insert 3 is guided during insertion of the insert 3 is expanded by the contact surfaces 117. Accordingly, it is easier to insert the insert 3 into the holding portions 103, making the assembly work of the box 5 easier.

(2b) In the clip 101, the contact surface 117 is formed on one spring piece 105. Thus, there is no longer a need to increase the size of the clip 101 in the front-back direction or the left-right direction in order to provide the contact surface 117.

3. Other Embodiments

While embodiments of the present disclosure were described above, embodiments of the present disclosure are not limited to those described above and can have various forms within the technical scope of the present disclosure.

(3a) The configuration of the clip is not limited to the configurations illustrated as embodiments. For example, while each of the embodiments described above illustrates an example of a clip including two holding portions, the clip may be configured to include only one holding portion, or three or more holding portions.

Further, each of the embodiments described above illustrates an example of a chip having a configuration in which the clip is fixed to a printed wiring board by the soldering of the joining surface 21 to the conductive portion of the surface of the printed wiring board, in other words, a so-called surface-mounted clip that is mounted to the surface of the printed wiring board. Nevertheless, the clip may be configured so that soldering is performed at a portion other than the joining surface 21. For example, the clip may be configured to be fixed to the printed wiring board by through-hole mounting. In this case, the base portion 11 may be configured to include a lead terminal, or a portion of the base portion 11 may be configured to be provided with a notch bent in a direction opposite to the first portion, and inserted and connected through a through-hole, without the provision of a lead terminal. The lead terminal and the bent portion of the base portion 11 are examples of the joining portion.

That is, as long as the joining portion is fixed by soldering to the conductive portion of the printed wiring board and the holding portion and the guiding portion are included, the clip may have various forms including configurations other than the above.

(3b) While each of the embodiment described above illustrates an example of a configuration in which the contact surfaces are disposed on the left and right facing each other, one contact surface may be disposed on only one of the left and right, or the contact surfaces may be disposed in positions on the left and right that do not face each other. For example, in a configuration in which there are two or more holding portions, the clip may be configured to include a holding portion provided with the contact surface only on the spring piece on the right side, and a holding portion provided with the contact surface only on the spring piece on the left side.

(3c) The contact surface may be provided to a portion other than the guiding portions 15 and the one spring piece 105 described in the embodiments above. For example, the contact surface may be disposed frontward of the holding portion on the front side or backward of the holding portion on the back side. Further, the clip may be configured so that the guiding portion 15 is not provided and the contact surface 117 is formed only on one spring piece 105.

(3d) The contact surface as a whole may be provided in any position as long as at least a portion is above the second portion of one spring piece and the position is farther away from the second portion on the corresponding spring piece side than the second portion of the one spring piece. For example, in relation to the left-right direction, there may be a space between the range in which the second portion provides guidance and the range in which the contact surface provides guidance.

Note that the contact surface need only be provided so as to satisfy the positional relationship described above for at least one of the pair of spring pieces of the clip. That is, the length in the left-right direction in which the insert 3 can be guided need only be expanded for at least one spring piece.

(3e) While the embodiments described above illustrate an example of a configuration in which the insert 3 is a member having a plate shape, the shape of the insert 3 is not limited thereto. For example, the insert 3 may be a member having a pillar shape, or a member having a curved shape.

(3f) The length of the slit 3a provided to the insert 3 is not particularly limited. For example, the slit 3a may be formed having a length sufficiently long compared to a width of the coupling portion 37. Specifically, while the length is conceivably 20% or greater compared to the width of the coupling portion 37, the length may be 50% or greater. Here, a direction of the length is a direction orthogonal to both the insertion direction and the facing direction, that is, the front-back direction, with the insert 3 sandwiched between the first spring piece and the second spring piece.

Figure 10A:
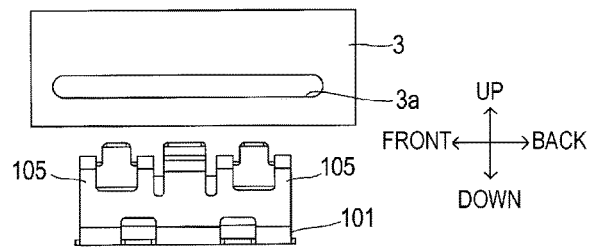
FIGS. 10A to 10C is a schematic view for explaining a modification of a slit.
Figure 10B:
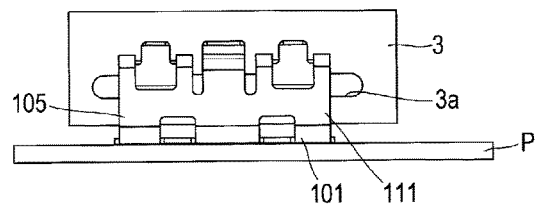
Figure 10C:
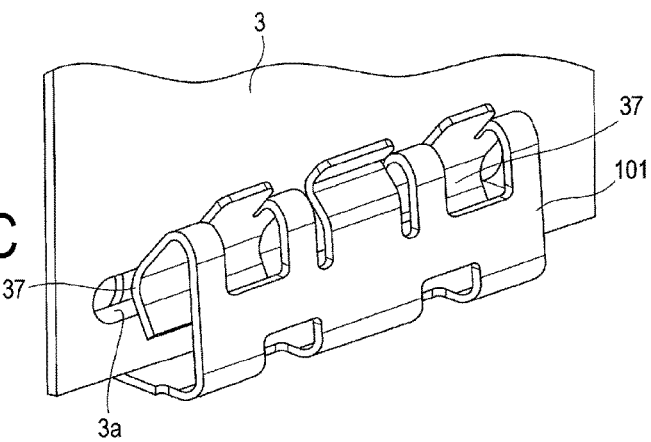

Further, as illustrated in FIGS. 10A to 10C, the slit 3a may be formed longer than a width from a front end of the spring piece 105 on the front side to a back end of the spring piece 105 on the back side, that is, longer than a length that includes the two coupling portions 37 inserted into the slit 3a.

When the slit 3a is thus increased in length, the coupling portion 37 of one spring piece 105 is inserted into the slit 3a even when an insertion position of the insert 3 is shifted frontward or backward during assembly. Further, the insert 3 can be fixed to a suitable position with respect to a printed wiring board P even when the attachment position of the clip 101 is slightly shifted frontward or backward with respect to the printed wiring board P.

Note that while FIGS. 10A to 10C illustrate an example of a configuration in which the two coupling portions 37 are inserted into one slit 3a, the slit 3a may be individually formed so as to correspond to each of the coupling portions 37.

Further, in contrast to the configuration described above, the length of the slit 3a in the front-back direction may be configured to be substantially equal to the width of one coupling portion 37, with only a slight amount of clearance during insertion. Further, the length of the slit 3a in the front-back direction may be configured to be substantially equal to the length from a front end of the coupling portion 37 positioned most frontward of the plurality of coupling portions 37, to a rear end of the coupling portion 37 positioned most backward. With the slit 3a and the coupling portions 37 thus configured, it is possible to achieve positioning after assembly of the insert 3.

Note that the slit 3a may have a shape that does not extend all of the way through. That is, a space such as a groove or a hole that allows insertion of the coupling portion 37 when the first spring piece and the second spring piece sandwich the insert 3 need only be formed on at least one of the front surface or the rear surface of the insert 3.

Further, when a plurality of holding portions are provided on the clip, the slit 3a may be configured so that at least one coupling portion 37 is inserted therein. Further, when the length of the slit 3a is made sufficiently long compared to the coupling portion 37, the configuration may be such that one or more coupling portions 37 are inserted into the slit 3a, or one or more coupling portions 37 are not inserted into the slit 3a.

Further, the slit 3a may be divided and formed in a plurality of positions. For example, conceivably a plurality of the slits 3a may be disposed side-by-side in the length direction of the slit 3a. Further, when a plurality of holding portions are provided to the clip, the clip may be configured so that the coupling portions 37 are inserted into one or more of the slits 3a. Further, the clip may be configured so that one or more of the coupling portions 37 are inserted into one of the slits 3a. That is, the clip may be configured so that a plurality of the slits 3a are formed in the insert 3, a plurality of the holding portions are formed in the clip, and one of the connecting portions 37 is inserted into one of the slits 3a.

(3g) The embodiments described above illustrate examples of configurations in which the contact surface 41 and the contact surface 117 guide the insert 3 toward a position between the first spring piece and the second spring piece of the pair of spring pieces 23 or the pair of spring pieces 105 when the insert 3 moves in the insertion direction, and the contact surface 41 or the contact surface 117 comes into contact with the insert 3. In other words, the embodiments illustrate examples of configurations in which the contact surface may not come into contact with the insert 3 when the insert 3 is inserted into the holding portions 13 or the holding portions 103.

However, when the contact surface is formed so as to be longer toward the center portion in the left-right direction than in the configurations illustrated in the embodiments described above and the insert 3 is inserted between the pair of spring pieces, the clip may be configured so that the insert 3 always comes into contact with the contact surface. When the clip is thus configured, guidance of the insert 3 by the contact surface can be executed at a higher level.

(3h) The function of M (where M is an integer of 1 or greater) components in the embodiments described above may be dispersed into N (where N is an integer greater than M) components, and the function of the N components may be integrated into that of M components. Further, at least part of the configuration of the above-described embodiments may be replaced with a known configuration having the same function. Parts of the configurations in the above-described embodiments may be omitted. At least part of the configuration of one of the above-described embodiments may be added to or replace the configuration of another of the above-described embodiments. Note that all embodiments encompassed within the technical spirit defined by the language of the appended claims fall within the scope of the present disclosure.

(3i) In addition to the clip 1 and the clip 101 described above, the present disclosure may be achieved in various forms, such as a fixing mechanism provided with the clip 1, the clip 101, and the insert 3 as components, and an assembly method thereof.

The invention claimed is:

1. A clip to be soldered to a conductive portion of a printed wiring board, the clip comprising:
a base portion having a plate shape and including a joining portion soldered to the conductive portion;
at least two holding portions each comprising a pair of spring pieces including a first spring piece and a second spring piece connected to the base portion and facing each other, and disposed side-by-side allowing an insert having a plate shape inserted between the first spring piece and the second spring piece to be sandwiched from a front surface side and a rear surface side; and
two guiding portions extending from different positions of the base portion to face each other, and configured to guide the insert to a position between the first spring piece and the second spring piece,
the first spring piece and the second spring piece constituting the at least two holding portions each including a first portion extending in a direction that intersects the base portion, and a second portion connected in a bent manner to an end portion of the first portion opposite to an end portion connected to the base portion, and extending in a direction toward the corresponding spring piece of the pair of spring pieces as well as in a direction approaching the base portion, and configured to be elastically displaceable in a facing direction, the facing direction being a direction in which the first spring piece and the second spring piece are disposed side-by-side,
the two guiding portions each including a contact surface configured to guide the insert toward a position between the first spring piece and the second spring piece in a case where the insert moves in an insertion direction and the guiding portion comes into contact with the insert, and a contact surface support portion that supports the contact surface, the insertion direction being the direction of movement of the insert from a state of not being sandwiched to a state of being sandwiched by the first spring piece and the second spring piece,
the contact surface provided to each of the two guiding portions being disposed between the at least two holding portions in relation to the direction the at least two holding portions are disposed side-by-side,
the contact surface being at least partially, in relation to the insertion direction, in a position farther away from the base portion than the second portion of at least one of the first spring piece or the second spring piece and, in relation to the facing direction, in a position farther away from the corresponding spring piece than the second portion of the pair of spring pieces, the base portion being provided with a suction surface for a case where the clip is suctioned by a suction nozzle, in a region between the two guiding portions, and each of the contact surface support portion of the two guiding portions and the first portion being connected by a connecting portion.

2. The clip according to claim 1, wherein at least one of the first spring piece or the second spring piece includes a third portion extending from the second portion in a direction opposite to the direction toward the corresponding spring piece of the pair of spring pieces, and in a direction away from the base portion; and the contact surface is formed at least on the third portion.

3. A fixing mechanism comprising:

a clip; and an insert, the clip including a base portion having a plate shape and including a joining portion soldered to a conductive portion of a printed wiring board, at least two holding portions each including a pair of spring pieces including a first spring piece and a second spring piece connected to the base portion and facing each other, and disposed side-by-side allowing an insert having a plate shape inserted between the first spring piece and the second spring piece, to be sandwiched from a front surface side and a rear surface side, two guiding portions extending from different positions of the base portion to face each other, and configured to guide the insert to a position between the first spring piece and the second spring piece, and a convex portion provided to at least one of the pair of spring pieces including the first spring piece or the second spring piece and is convex toward the other of the pair of spring pieces that differs from the at least one of the pair of spring pieces, the first spring piece and the second spring piece constituting the at least two holding portions each including a first portion extending in a direction that intersects the base portion, and a second portion connected in a bent manner to an end portion of the first portion opposite to an end portion connected to the base portion, and extending in a direction toward the corresponding spring piece of the pair of spring pieces as well as in a direction approaching the base portion, and configured to be elastically displaceable in a facing direction, the facing direction being a direction in which the first spring piece and the second spring piece are disposed side-by-side;

the two guiding portions each including a contact surface that comes into contact with the insert and configured to guide the insert toward a position between the first spring piece and the second spring piece when an external load acts on the insert, moving the insert in an insertion direction, and a contact surface support portion configured to support the contact surface, the insertion direction being the direction of movement of the insert from a state of not being sandwiched to a state of being sandwiched by the first spring piece and the second spring piece, the contact surface provided to each of the at least two guiding portions being disposed between the at least two holding portions in the direction the at least two holding portions are disposed side-by-side, the contact surface being at least partially, in relation to the insertion direction, in a position farther away from the base portion than the second portion of at least one of the first spring piece and the second spring piece and, in relation to the facing direction, in a position farther away from the corresponding spring piece than the second portion of the pair of spring pieces, the base portion being provided with a suction surface for a case where the clip is suctioned by a suction nozzle, in a region between the two guiding portions, each of the contact surface support portions of the two guiding portions and the first portion being connected by a connecting portion, the convex portion being a coupling portion of the second portion and a leading edge portion that is connected to the second portion, bends at the extended leading edge of the second portion, and extends in a direction approaching the first portion of the at least one of the pair of spring pieces and in a direction approaching the base portion, and the insert including an insertion space where the convex portion is inserted when the insert is sandwiched between the first spring piece and the second spring piece.

4. The fixing mechanism according to claim 3, wherein the insertion space of the insert is formed having a length greater than a length of the convex portion by a predetermined ratio or greater in a direction orthogonal to both the insertion direction and the facing direction, with the insert sandwiched between the first spring piece and the second spring piece.

* * * * *